United States Patent
Briggs

(10) Patent No.: US 7,747,546 B2
(45) Date of Patent: Jun. 29, 2010

(54) INFORMATION REGISTER USING ENDOHEDRAL FULLERENES IN NANOTUBE

(75) Inventor: George Andrew Davidson Briggs, Oxford (GB)

(73) Assignee: Isis Innovation Limited, Oxford (GB)

( * ) Notice: Subject to any disclaimer, the term of this patent is extended or adjusted under 35 U.S.C. 154(b) by 963 days.

(21) Appl. No.: 10/483,075

(22) PCT Filed: Jul. 10, 2002

(86) PCT No.: PCT/GB02/03176

§ 371 (c)(1),
(2), (4) Date: Jul. 22, 2004

(87) PCT Pub. No.: WO03/007234

PCT Pub. Date: Jan. 23, 2003

(65) Prior Publication Data

US 2004/0247241 A1 Dec. 9, 2004

(30) Foreign Application Priority Data

Jul. 11, 2001 (GB) .................................. 0116943.2

(51) Int. Cl.
*G06E 1/00* (2006.01)
*G06E 3/00* (2006.01)
*G06F 15/00* (2006.01)
*G06G 7/00* (2006.01)
*G06N 99/00* (2010.01)

(52) U.S. Cl. ....................................................... 706/10

(58) Field of Classification Search .................... 706/10, 706/14, 46; 977/700, 707, 720, 742
See application file for complete search history.

(56) References Cited

U.S. PATENT DOCUMENTS

| 5,917,322 | A  | * | 6/1999 | Gershenfeld et al. | ......... 324/307 |
| 6,419,191 | B1 | * | 7/2002 | Hoyt et al. | ............... 244/158.2 |
| 6,664,559 | B1 | * | 12/2003 | Herr et al. | ...................... 257/14 |
| 2002/0145826 | A1 | * | 10/2002 | Zangari et al. | .............. 360/135 |

FOREIGN PATENT DOCUMENTS

| JP | 10-254569 | 9/1998 |
| WO | 00/44094 | 7/2000 |

(Continued)

OTHER PUBLICATIONS

Young-Kyun Kwon et al., "Bucky Shuttle" Memory Device: Synthetic Approach and Molecular Dynamics Simulations, Feb. 15, 1999, The American Physical Society, 1470-1473☐☐☐☐.*

(Continued)

*Primary Examiner*—Donald Sparks
*Assistant Examiner*—Peter Coughlan
(74) *Attorney, Agent, or Firm*—Wenderoth, Lind & Ponack, L.L.P.

(57) ABSTRACT

An information register stores information represented by the states of endohedral fullerenes in a nanotube. Possible states are spin-states or morphological states, such as endohedral species having intrinsic or induced electric dipole moment or characteristic electric polarizility. The states of successive endohedral fullerenes along the nanotube are coupled by interaction mediated by electrons in the nanotube. The register can be used as part of a quantum computer or a classical computer.

34 Claims, 1 Drawing Sheet

FOREIGN PATENT DOCUMENTS

| WO | 00/48195 | 8/2000 |
|---|---|---|
| WO | 01/57917 | 8/2001 |

OTHER PUBLICATIONS

Deepark Srivastava, Computational Nanotechnology with Carbon Nanotubes and Fullerenes, Jul. 4, 2001, IEEE, 42-54.*

Mark Brebob et al., The Potential of Carbon-based Memory Systems, Aug. 1999, Michigan State University.*

Seongjun Park et al., Endo-Fullerene and Doped Diamond Nanocrystallite-Based Models of Qubits for Solid-State Quantum Computers, Mar. 2001, American Scientific Publishers, 75-80.*

The quest for the quantum computer: Brown, 2000, touchstone.*

N @ C60 for quantum computing: Harneit, 2000, Conference proceedings of the IWEPNM-2000 in Kirchberg Austria.*

Encapsulated C60 in carbon nanotubes, 1998, nature, vol. 396 pp. 323-324.*

"Bucky Shuttle" Memory Device: Synthetic approach and molecular dynamics simulations: Kwon, 1999, The American Physical Society, vol. 82, No. 7 pp. 1470-1473.*

Kwon Y.K., et al., *"Bucky Shuttle", Memory Device: Synthetic Approach and Molecular Dynamics Simulations*, Physical Review Letters, Feb. 15, 1999, APS, USA, vol. 82, No. 7, pp. 1470-1473.

Harneit W., et al., *"NC60 for Quantum Computing"*, AIP Conference Proceedings, American Institute of Physics, New York, NY, US, Mar. 4, 2000, pp. 207-210.

Brehob M., et al., *"The Potential of Carbon-based Memory Systems"*, Memory Technology, Design and Testing, 1999. Records of the 1999 IEEE International Workshop on San Jose, CA, USA Aug. 9-10, 1999, Los Alamitos, CA, USA IEEE Comput. Soc., US, Aug. 9, 1999, pp. 110-114.

Park S., et al., *"Endo-fullerene and Doped Diamond Noncrystallite-based Models of Qubits for Solid-state Quantum Computers"*, Journal of Nanoscience and Nanotechnology, American Scientific Publishers, US, vol. 1, No. 1, Mar. 1, 2001, pp. 75-81.

Srivastava D., et al., *"Computational Nanotechnology with Carbon Nanotubes and Fullerenes"*, Computing in Science and Engineering, IEEE, Piscataway, NJ, US, vol. 3, No. 4, Jul. 4, 2001, p. 42-55.

* cited by examiner

INFORMATION REGISTER USING ENDOHEDRAL FULLERENES IN NANOTUBE

BACKGROUND OF THE INVENTION

1. Field of the Invention

The present invention relates to an information register which can be loaded with data and can perform operations on those data. In particular, the information register can be used in a quantum computer or a classical computer. A classical computer is any device which processes purely classical information regardless of how advanced its technology may be, whereas a quantum computer is a device which processes quantum information (for example quantum superpositions of 0 and 1, called qubits, discussed below).

2. Description of Related Art

The field of quantum computation has been the subject of much recent research. However, to construct a practical quantum computer there are a number of requirements.

In a quantum computer, information is represented by the quantum-mechanical states of a system. In a two energy state system, the two states can represent the "basis states" 0 and 1, and such a system is known as a quantum bit or "qubit". One requirement is that the qubit must be under precise control in order to allow the production of superposition states of the two "basis states". Under the laws of quantum mechanics, the system can effectively be in more than one state at a particular time, and this superposition allows the qubit to represent the two individual states simultaneously. For example, in a binary mode, qubits can exist simultaneously as 0 and 1, with the probability for each state being given by a numerical coefficient.

A second requirement is that more than one of these qubits can be coupled together, such that their combined states are no longer individual qubit states, but are a combination of all the qubits together. For instance, three classical bits can form eight possible combinations: 000, 001, 010, 011, 100, 101, 110 and 111. In a coupled three-qubit system, these eight states must then be regarded as the basic states, and superpositions of all eight can be produced at the same time in a single three-qubit combination. This parallel representation of information has been shown to be highly advantageous for certain types of computer algorithms, for example factorization and searching an unordered list.

A third, very important, requirement for the successful operation of a quantum computer is that the desired states are maintained when the qubits are in real environments, i.e. where they can interact with their surroundings. In this situation they form part of a much bigger and more complex quantum system. The effect of the environment is to "decohere" the system such that the quantum computation will no longer work after a characteristic decoherence time.

Conventionally, there have been problems in providing an element, such as an information register, for a quantum computer which can meet these three requirements of single qubit control, appropriate inter-qubit interactions and small coupling to the environment.

Further problems exist with conventional computers, for example, that it is difficult to address simultaneously many bits and providing wiring to all the individual bits becomes very difficult, particularly as the size of the device is reduced.

SUMMARY OF THE INVENTION

Accordingly, the present invention provides an information register comprising a plurality of units within a nanotube, each unit having a plurality of states useable for representing information.

The nanotube can provide a means of self assembly of units in a linear array. The nanotube can also mediate a coupling interaction between the information-representing states of the units which can be precisely controlled.

According to a first preferred feature of the invention, the plurality of information-representing states of each unit correspond to different spin states of the unit.

According to a further preferred feature of the invention, the plurality of information-representing states of each unit correspond to different morphological states which have an electric dipole moment, which may be intrinsic or induced in an applied electric field. The qubit can thus be represented either as different orientations of the electric dipole or as different electric polarizibility values.

Preferably the information register comprises a plurality of different unit types, the units being arranged in the nanotube such that the unit types form a periodic pattern. This has the advantage that global addressing of the units can be used, whereby only those units of a particular type can be selectively addressed. This removes the need to be able to individually address each unit and therefore enables the device to be made more compactly and simplifies the requirement for providing electrodes; i.e. it removes the need for local control [see S. C. Benjamin, Phys. Rev. A 61 020301 (2000)].

Advantageously, at least some of the units may have more than two states, and some of the additional states can be used for error detection.

Preferably each unit comprises an endohedral fullerene. The fullerene provides a means of screening out environmental effects such that decoherence time can be increased. The endohedral species can be a single atom or diatomic species within the fullerene cage which can represent information by its spin. Alternatively, the endohedral species can be ammonia-like molecules of the form $X_3N$ which are capable of representing information by different morphological states.

Preferably at least some of the fullerenes comprise at least one functional group attached thereto. The functional group may provide some or all of the following advantages: enabling different endohedral fullerene types to be joined in a specific sequence; enabling the endohedral fullerenes to be inserted into the nanotube in a particular orientation; and spacing the endohedral fullerenes at specific distances apart along the nanotube.

According to an alternative preferred aspect of the invention, each unit comprises a superparamagnetic cluster in the nanotube, each superparamagnetic cluster having a plurality of energy states for representing information. Preferably the superparamagnetic clusters are Fe8 or Mn12.

Alternatively, each unit comprises a species having at least one unpaired electron. Examples of suitable species include those known as molecular magnets, such as an organometallic molecule or coordination molecule, having a lanthanide or transition metal center which has at least one unpaired electron, for example $V(C_5H_5)_2$ with spin ½ and $Cr(C_5H_5)_2$ with spin 1.

The present invention further provides a method of addressing, for use with an information register, said method comprising: providing an information register as described above; passing a current through at least one electrode associated with at least one information-representing unit of said register; and applying electromagnetic radiation of a predetermined frequency to the register. Preferably at least one of the current and electromagnetic radiation is pulsed, and preferably a plurality of said units of the register are simultaneously addressed.

BRIEF DESCRIPTION OF THE DRAWINGS

Embodiments of the invention will now be described, by way of non-limitive example, with reference to the accompanying drawing, in which:—

DETAILED DESCRIPTION OF THE INVENTION

Figure 1:
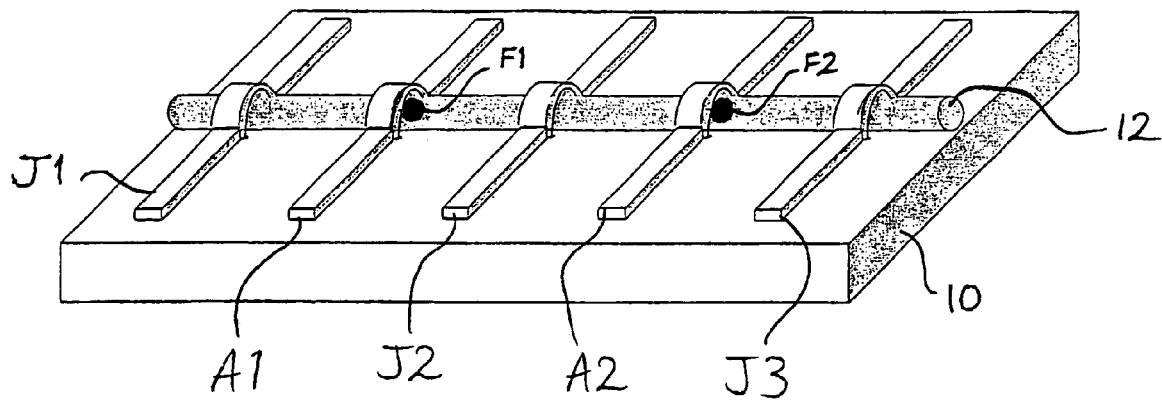
FIG. 1 is a schematic diagram of an information register according to an embodiment of the invention.

Specific preferred components for constructing embodiments of the information register of the invention will firstly be described, followed by the overall structure and operation of the device.

In the first embodiment, the "unit" or multi-state system for representing the information is an endohedral fullerene. The term "Fullerene" refers to a cage-like structure formed of carbon atoms and also known as carbon buckminster-fullerene or bucky-balls. The cage can be written as $C_n$, and the cage can be of various sizes; preferred embodiments include n=60, 70, 74, 80, 82, 84, 86, 88, 90, 92 and 94. $C_{60}$ is spherical, but the other fullerenes are elongated. The diameter of the fullerene is typically of the order of 1 nm. The term fullerene used herein also encompasses derivates of the basic buckminster-fullerene cages.

The term "Endohedral" means that a species is located within the fullerene cage. According to one embodiment, the endohedral species is a single atom of an element that donates electrons to the cage. This leaves the cage with a charge and under appropriate conditions a spin. The term "spin" is used herein in the quantum-mechanical sense to refer to a magnetic dipole moment. The projection of the spin on some arbitrary axis is quantized and it is these states which are used for representing information. If the spin has the value ½, there are two quantized states which can be used for the qubit. If the spin is larger, there are more than two states and two of them can be chosen for the qubit. The others can also be used, either as further qubits or in number systems with base greater than two or in error correction. In some endohedral fullerene systems embodying the invention, the spin resides on the endohedral species rather than on the cage, but for embodiments employing spin states for representing information, it is merely necessary that the endohedral fullerene system as a whole has a net spin.

Electron spin resonance (ESR) measurements have shown that endohedral fullerenes with appropriate spin properties include examples where the endohedral species is atomic Er, Gd, P, La, Lu, N, Sc, Tm, Y, Ho, Pr or Dy, in a variety of different size fullerene cages. The endohedral species can also be diatomic, such as $Er_2$, $Hf_2$ or $La_2$.

One preferred embodiment is endohedral nitrogen in $C_{60}$ (i.e. a single nitrogen atom inside a carbon bucky-ball, written as $N@C_{60}$). This has a narrow line width spin resonance of 0.7 µT, and so offers a decoherence time in excess of 100 µs even at room temperature. Another preferred embodiment is $La@C_{82}$. A long decoherence time (when compared to a typical gate operation time) is one of the five fundamental requirements for a quantum computer [see D. P. DiVincenzo Fortschr. Phys. 48 (9-11) 711 (2000)]. It is conventionally labelled requirement III.

Another embodiment of an endohedral fullerene for representing information is to use a polar molecule, which has a well defined electric dipole up-down transition, as the endohedral species. Preferred endohedral species include ammonia-like molecules of the form $X_3N$. This type of molecule has an asymmetric form, with the three X's arranged in a plane with the nitrogen atom displaced either above or below that plane. In the example of ammonia, each X is a hydrogen atom, and the ammonia molecule has two energy levels consisting of symmetric and antisymmetric superpositions of the molecular structure with the plane of the hydrogen atoms above or below the nitrogen atom. In general, the asymmetric morphology of this type of molecule gives it different energy states, which may depend on an applied field.

A preferred embodiment is for the X to be a rare earth metal atom, and in particular Sc or Er, and the endohedral fullerenes can be written as $Sc_3N@C_n$ and $Er_3N@C_n$.

In the endohedral species of the form $X_3N$, each X is not limited to being a single atom, but could, for example, be a chemical group. It is also not necessary for the three X's to be the same. For example, $ErSc_2N$ has been fabricated in buckyballs.

Embodiments of the information register according to the invention comprise a plurality of endohedral fullerenes as described above, in a nanotube. According to one embodiment, the nanotube is a single walled carbon nanotube (SWNT). SWNT's can be considered to be graphite sheets rolled up into a cylindrical form. SWNT's can be made with a variety of conducting properties according to the angle of the axis around which the sheet is rolled relative to the symmetry directions in the hexagonally arranged carbon sheet. The nanotube is, of course, not literally made by rolling up a graphite sheet, but known techniques can be used to fabricate and purify nanotubes and to select their properties [see: 1. Carbon Nanotubes and Related Structures; Peter Harris, CUP, Cambridge (1999); and 2. Science of Fullerenes and Carbon Nanotubes; Dresselhaus, Dresselhaus and Ekland, Academic Press, London (1995)]. It is preferred to use semiconductive or metallic nanotubes [metallic in the sense of the conducting properties], as will be explained below. Embodiments of the invention are not limited to carbon nanotubes; the nanotubes could be made of, for example, molybdenum disulphide, or any other suitable substance. The invention can also be embodied in a multi-walled nanotube (MWNT), comprising a plurality of SWNT's of different diameters arranged as concentric cylinders. MWNT's are easier to make, but it is more difficult to control their properties. The inner diameter of an SWNT or of the innermost nanotube in an MWNT must be sufficient to enable fullerenes to occupy positions within the nanotube. Typically, the diameter would be at least 1.4 nm for fullerenes, but could be smaller for molecular magnets. Insertion of the endohedral fullerenes inside a nanotube can be performed using known techniques, such as sublimation.

The nanotube provides two effects. Firstly, the nanotube provides a means of self assembly of a linear array of endohedral fullerenes. Secondly, the tube can provide interactions coupling different endohedral fullerenes within the tube. For example, where the information is represented by the spin state of an endohedral fullerene, an interaction between the state on different endohedral fullerenes within the tube can be mediated via the conduction electrons of the tube by the indirect exchange interaction. In the indirect exchange interaction, conduction electrons on the tube or tubes, which also have spin, are used to transmit information about one qubit down the tube to the next qubit, through magnetic spin-spin interactions. The one-dimensional nature of the tube means that this interaction is enhanced in comparison with similar effects in three dimensions.

In the case where information is represented by the electric dipole of endohedral fullerenes, the coupling is mediated by electric dipole-dipole interactions in which the electric field created by one dipole is felt by neighbouring dipoles within the nanotube.

In any of the above embodiments, the coupling, whether direct or mediated via the nanotube, can enable interaction between the states of endohedral fullerenes separated by distances which in some embodiments can be greater than the diameter of the tube.

Embodiments of the invention may also be provided with electrodes positioned adjacent to the nanotube at locations between endohedral fullerenes. By applying a bias voltage, the electrode acts as a gate which can be used to deplete the conduction electrons from the nanotube in the vicinity of the electrode. This principle of operation is similar to the known carbon nanotube field effect transistor (FET) (see: S. J. Tans, A. R. M. Verschueren and C. Dekker; Nature 393 49 (1998)). The bias voltage applied to the gate enables the coupling interaction between endohedral fullerenes in the nanotube to be modulated, and in particular the coupling can be turned on and off.

FIG. 1 illustrates, schematically, an embodiment of an information register according to the invention. It comprises a substrate 10, such as a silicon wafer which has been oxidized so that it has an insulating layer of $SiO_2$ on its surface. A nanotube 12 is provided on the surface of the substrate 10. Two endohedral fullerenes F1 and F2 are located within the nanotube 12. Metallic electrode gates J1, J2, J3, A1 and A2 are formed on the substrate 10 and overlapping the nanotube 12, by lithographic processes, such as electron beam lithography. The nanotube 12 is coated with a very thin layer of an insulator, such as a glass, laid down by a sputtering process, in order to isolate electrically the nanotube 12 from the gate electrodes.

In practice, FIG. 1 illustrates only a portion of a device which can be much longer, having many more endohedral fullerenes and corresponding gates repeating the pattern of FIG. 1. This scalability is another (number I) of the five requirements for a universal quantum computer. An array may also be formed comprising many such parallel nanotubes 12 on the substrate 10. However, the principle of operation can simply be described with reference to FIG. 1.

1. The gate J2 is biased to isolate the endohedral fullerenes F1 and F2 from each other and gates J1 and J3 are biased to isolate the illustrated portion of the nanotube 12 from the rest of the device. The quantum state of each endohedral fullerene F1 and F2 is then set to desired starting states by applying electromagnetic radiation to the device and by controlling the current through the electrodes A1 and A2. In the case of the information being represented by the spin state of the endohedral fullerenes, a uniform magnetic field is applied parallel to the axis of the nanotube 12. This lifts the degeneracy of the spin states such that there is an energy difference between the spin states parallel and antiparallel to the magnetic field and each spin is allowed to relax to its ground state. The spin resonance frequency of each endohedral fullerene will depend on the combination of the uniform field over the device and the local field which is controlled by varying the current through the "A" electrodes. An electromagnetic pulse at the resonance frequency can then be applied to the whole nanotube. Depending on the particular endohedral fullerene system and the local and global fields, the resonant frequency can be in the radio, microwave, infrared, visible, ultraviolet or other part of the electromagnetic spectrum, and can be applied, for example, using a laser (not shown) or an external coil (not shown) surrounding the device, or a combination of such electromagnetic field sources.

By controlling the duration of the electromagnetic pulse, a precise spin state can be induced in an endohedral fullerene system at the resonant frequency. Thus the spin state of the endohedral fullerene can be set to a desired condition. However, these changes in spin states will only occur if the endohedral fullerene is at its resonant frequency. Thus, by applying different currents through the "A" electrodes, the local field and thus the resonance frequency of the endohedral fullerenes F1 and F2 will be different, and thus, for a given electromagnetic field pulse, it can be selected which of the endohedral fullerenes will respond, so that their states can be independently set. (This is fundamental requirement II.)

In the case of information being represented by the state of the electric dipole moment of the endohedral fullerene F1 and F2, the initial states can be set in a similar way to that described above except that an electric field is used in place of the magnetic field. For example, an appropriate bias voltage can be applied to electrodes A1 and/or A2, instead of a current, in order to control the local electric field at the endohedral fullerene. An AC pulse at the dipole transition frequency is applied, for example as electromagnetic radiation, to control the dipole state.

Although described above in terms of controlling the local field at each endohedral fullerene using the appropriate "A" electrode to tune the resonance frequency of the endohedral fullerene system, and then applying an electro magnetic pulse, also known as a Rabi pulse, it is equally possible, in an alternative embodiment, to apply continuous-wave electromagnetic radiation to the device, and then to pulse the current or voltage on the desired electrode.

Thus, the initial states represented by the endohedral fullerenes can be individually selected using the "A" gates, indeed a whole string of qubits can be initialised. In a sustained computation, the state of any endohedral fullerene may, of course, arise from another part of the calculation, and may be a quantum superposition.

2. Once the states of endohedral fullerenes F1 and F2 have been set accordingly, the gate J2 is set to permit interaction between the states via conduction electrons in the tube 12. The gates J1 and J3 can remain set to give isolation from the remainder of the nanotube, or alternatively, a desired number of "J" gates can be set to allow coupling between a string of qubits along the nanotube 12 to allow highly parallel multi-qubit superpositions to be produced.

3. There are two relevant energy scales in the operation of the two-qubit logic gate. Consider first the energy difference between a spin aligned parallel to the magnetic field and the same spin aligned antiparallel to the field. Let this energy difference be called E1 for fullerene F1 and E2 for fullerene F2. Then the first important energy scale is $\Delta E = E1 - E2$. E1 and E2 can be altered by means of: changing the currents through gates A1 or A2; or by using different endohedral species; or by using a magnetic field gradient. The second energy scale is the spin-spin interaction energy V. If $\Delta E$ is much greater than V, the two-qubit gate would operate as follows: J1 and J3 remain closed, and in the case of spin states, a selecting current is passed through gate A2 and an electromagnetic spin resonance pulse is applied that will cause a spin flip in F2 depending on the state of F1. In this way, the logical operation of a "controlled-NOT gate" for F2 can be produced. The resulting state of F2, can of course, be a superposition of states. The same operation can be achieved using states other than spin, such as electric dipole moments. Alternatively, when V is greater than or approximately equal to $\Delta E$, the time integral of the interaction between F1 and F2 can be controlled by switching J2 from off to on and off again to produce entangled states. The resulting operation is suitable for quantum computation. As mentioned above, multi-qubit gates can be created using this architecture, but it has been shown that almost any two-qubit gate, together with single qubit manipulations, are sufficient operations for a universal quantum computer. (This is condition IV.)

4. The result of the calculation of the previous step can be passed to another stage in the calculation, for example by opening gate J3 and performing a logic operation between F2 and the next endohedral fullerene (not shown) further along the nanotube 12, or else the result can be read out. A readout structure, although not part of the present invention, could be, for example in the case of spin states, an ultra sensitive nano-SQUID, or for the case of electric dipole states, a single-electron transistor electrometer could be used to measure the dipole moment state. (Readout is condition V.)

The embodiment described above and with reference to FIG. 1 shows separate "J" and "A" gates. However, according to a further embodiment, the "A" gates can be removed altogether and their function combined with the "J" gates. For example, in the case in which information is represented by the spin state of the endohedral fullerene F1, applying appropriate current through gates J1 and J2 can produce a unique field at the location of F1, and thus the spin state at F1 can be manipulated independently of F2. The DC bias voltage applied to the gates J1 and J2 can still be used to control the coupling interaction between endohedral fullerene F1 and neighbouring locations along the nanotube 12.

A further embodiment which eliminates the need to address each qubit or bit individually is to use more than one type of endohedral fullerene. The different types can be distinguished from each other by, for example, having different endohedral species and/or different fullerene cages, such that the different types have different properties. In the case of spin-state representation of information, the different endohedral fullerene types could have different spin-flip resonance frequencies.

One example would be to use two different types referred to by the labels A and B, with distinct resonant frequencies. The different types of endohedral fullerene are arranged along the nanotube 12 in an alternating pattern ABAB. When a field at one particular frequency is applied, only the type A qubits will respond, and when a different particular frequency field is applied, only the type B qubits will respond. In each case the response depends on the states of the neighbours. It has been shown that quantum computing can be performed by applying such global transformations, i.e. to all qubits of type A or type B across the device, as opposed to applying local transformations to each qubit which requires individual addressing.

One way to realize such global architectures is to make use of functional groups attached to the endohedral fullerenes. For example, fullerenes of type A, such as fullerenes having a particular endohedral species, are prepared with an attached functional group a, and B type fullerenes are prepared with an added functional group b. These added functional groups preferentially join a-b, rather than a-a or b-b. A reaction of the two species would therefore produce AB dimers. Examples of the functional groups a and b include a carboxylic acid and an alcohol joined in an esterification reaction, or an amide group and a carboxylic acid combined to form a peptide link.

A nanotube is then filled with the AB dimers. A further use of added functional groups is to give the dimers a specific polarity such that they preferentially enter the nanotubes either A first or B first. A filled tube would then have the necessary ABAB . . . architecture.

A yet further use of the functional groups attached to the fullerenes is to control the spacing of the fullerenes along the tube. For example, the functional groups a and b can be polymers of specific lengths to determine the inter-fullerene spacing. An alternative embodiment for controlling the spacing between the endohedral fullerenes is to insert "dummy" fullerenes which do not have information-representing endohedral species, such as plain buckyballs, between the endohedral fullerenes in the nanotube.

A further embodiment which has a reduced number of gate electrodes, and which uses a plurality of different endohedral fullerene types, is as follows. An electrode is provided over several different endohedral fullerene types, such as A, B, C arranged adjacent to each other along the nanotube. By applying a particular current or voltage to the gate, one of the types A or B or C can be selectively tuned to the frequency of an applied electromagnetic wave. By changing the current and/or voltage on the gate, the other two types can also be selectively addressed.

The above-described embodiments have been in terms of binary computation wherein each endofullerene system for representing information has two eigenstates, such as spin-up ($+\frac{1}{2}$) and spin-down ($-\frac{1}{2}$). However, for species having a magnitude of spin other than $\frac{1}{2}$, there may be more than two possible values for that spin relative to a particular axis. For example, a system with spin $\frac{3}{2}$ has four possible values of spin parallel to a particular axis, $+\frac{3}{2}, +\frac{1}{2}, -\frac{1}{2}$ and $-\frac{3}{2}$, which can therefore represent four possible states. The states in excess of two can also be used to represent information. For example, computations using tri-state or trinary arithmetic are known, or more than one binary qubit could be represented. In a further embodiment, one or more of the states in excess of two can be used for error detection, for example two states could represent the values 0 and 1, but if an error occurs the system falls into a third state which indicates that the corresponding bit or qubit is erroneous. The additional states can also be used to provide built-in redundancy and error correction or help with reading out the final state.

The above described embodiments have generally been in terms of an information register for a quantum computer in which superposition of states is possible to enable quantum parallelism. However, all of the above embodiments are equally applicable to a register for a classical computer. To do classical computation, some other conditions must be met. Either: (a) one must perform irreversible steps in the computation (where information is lost); or (b) three bit gates must be used. Condition (a) could be achieved through dissipative processes analogous to readout, and condition (b) is implemented through ineractions between several bits in the tube.

The architectures in which global addressing is possible are particularly advantageous because they remove the need for each bit to be individually addressed, which requires space, and therefore the device can have a higher packing density and reduced wiring complexity. In this case, for either quantum or classical computation, connections only need be made at the end or ends of the nanotubes, or if there is an array of nanotubes in the device, connections only need be made around the edge of the device. This gives greater fault tolerance.

A further embodiment, usable both for classical and quantum computation, is to provide a plurality of closely spaced parallel nanotubes with the same structure and the same endohedral fullerene systems at corresponding locations along the length and all of the nanotubes sharing the same electrode gates. In this way, the different nanotube registers all perform the same calculation in parallel and so there is built-in redundancy.

For quantum computation, many of the algorithms are "statistical"—i.e. the readout they produce depends on how the wavefunction collapses. They must be run several times to solve the problem at hand. For classical computation, the scheme of parallel nanotubes could be used (a) to strengthen the output signal OR (b) to run several non-deterministic (randomized) algorithms independently. In these algorithms several runs are required for convergence to a solution.

Another alternative embodiment of an information register according to the invention is to use a superparamagnetic cluster in place of each endohedral fullerene as the information-representing "unit". Examples of suitable superparamagnetic clusters include Fe8 and Mn12, see Nature 410 789 (2001). Alternatively, each information-representing unit can comprises a species, known as a molecular magnet, such as an organometallic molecule or coordination molecule, having a lanthanide or transition metal centre which has at least one unpaired electron, for example $V(C_5H_5)_2$ with spin ½ and $Cr(C_5H_5)_2$ with spin 1. The examples described in this paragraph can represent information by their spin-state, and can be used analogously to endohedral fullerenes, and with any of the device architectures described above in terms of endohedral fullerenes. These will not be described again in order to avoid unnecessary repetition.

The invention claimed is:

1. An information register comprising:
a substrate;
a nanotube provided on the substrate;
a plurality of units located within the nanotube, each of the units comprising an endohedral fullerene; and
a plurality of electrode gates provided on the substrate,
wherein each of the units has a plurality of states useable for representing information, and
wherein the plurality of information-representing states of each unit correspond to different spin states of the unit.

2. An information register according to claim 1, wherein interaction between the units is mediated by the nanotube via indirect exchange interaction.

3. An information register according to claim 1, wherein at least some of the units have one or more states in excess of two, useable for error detection.

4. An information register according to claim 1, wherein two states of each unit are useable for representing one of: one qubit of information, and one bit of information.

5. An information register according to claim 1, wherein at least some of the electrode gates are positioned adjacent to the nanotube at locations between the units for modulating interaction between the units to operate the information register in combination with the application of electromagnetic radiation.

6. An information register according to claim 1, wherein interaction between the units is mediated via the nanotube.

7. An information register according to claim 6, wherein the interaction is mediated via conduction electrons of the nanotube.

8. An information register according to claim 6, wherein the interaction is capable of being modulated.

9. An information register according to claim 8, wherein the electrode gates modulate interaction between the units.

10. An information register according to claim 1, wherein the units comprise a plurality of different types of endohedral fullerenes, the units being arranged in the nanotube such that the units of different types form a periodic pattern.

11. An information register according to claim 10, wherein the plurality of different types is two different types of endohedral fullerenes, wherein the units are arranged such that the units of different types alternate along the nanotube.

12. An information register according to claim 1, wherein the nanotube is one of: single-walled and multi-walled.

13. An information register according to claim 1, wherein at least some of the electrode gates are for individually addressing each unit.

14. An information register according to claim 13, wherein one or more of the units is addressable by using a combination of electrode gates and applied electromagnetic radiation.

15. An information register according to claim 14, wherein when addressing one of the units, a predetermined current is passed through one of the electrode gates relevant to the one unit.

16. An information register according to claim 15, wherein at least one of the current and the electromagnetic radiation is pulsed.

17. An information register according to claim 1, wherein two or more of the units are simultaneously addressable by electromagnetic radiation.

18. An information register according to claim 17, wherein the electromagnetic radiation is selected from the group consisting of: radio, microwave, infrared, visible, ultraviolet, and a combination thereof.

19. An information register according to claim 1, wherein the nanotube is one of: a carbon nanotube and a molybdenum disulphide nanotube.

20. An information register according to claim 1, further comprising empty fullerenes in the nanotube to space apart the units.

21. An information register according to claim 1, wherein the endohedral species comprise one or more selected from the group consisting of: Er, Gd, P, La, Lu, N, Sc, Tm, Y, Ho, Pr, Dy, $Er_2$, $Hf_2$, $Sc_3$ and $La_2$.

22. An information register according to claim 1, wherein the endohedral species are of the form $X_3N$, where X is one of: hydrogen and a rare earth element or elements.

23. An information register according to claim 22, wherein the rare earth element is selected from the group consisting of: Sc, Er and mixtures thereof.

24. An information register according to claim 1, wherein the fullerenes are selected from the group consisting of: $C_{60}$, $C_{70}$, $C_{74}$, $C_{80}$, $C_{82}$, $C_{84}$, $C_{86}$, $C_{88}$, $C_{90}$, $C_{92}$, and $C_{94}$.

25. An information register according to claim 1, wherein the endohedral fullerenes include endohedral fullerenes of a plurality of different types which are distinguished by one aspect selected from: the endohedral species, the fullerene, and combinations thereof.

26. An information register according to claim 1, wherein at least some of the fullerenes comprise at least one functional group attached thereto.

27. An information register according to claim 26, wherein the functional group is located between fullerenes in the nanotube to space the fullerenes apart.

28. An information register according to claim 1, wherein the fullerenes are present as dimers.

29. An information register according to claim 1, wherein each unit has at least one unpaired electron.

30. An information register according to claim 1, further comprising a plurality of the nanotubes arranged substantially parallel to each other, and each having a plurality of the units therein.

31. An information register according to claim 1, wherein the electrode gates are metallic.

32. A method of addressing comprising:

providing an information register comprising a substrate, a nanotube provided on the substrate, a plurality of units within the nanotube, each of the units comprising an endohedral fullerene, and a plurality of electrode gates provided on the substrate, wherein each of the units has a plurality of states useable for representing information, wherein the plurality of information-representing states of each unit correspond to different spin states of the unit;

passing a current through at least one of the electrode gates associated with at least one of the units of the information register; and applying electromagnetic radiation of a predetermined frequency to the information register.

33. A method according to claim 32, wherein at least one of the current and the electromagnetic radiation is pulsed.

34. A method according to claim 32, wherein a plurality of the units of the information register are simultaneously addressed.

* * * * *